US009644263B2

(12) United States Patent
Kim et al.

(10) Patent No.: US 9,644,263 B2
(45) Date of Patent: May 9, 2017

(54) METHOD FOR SYNTHESIS OF TRANSITION METAL CHALCOGENIDE

(71) Applicant: Industry-Academic Cooperation Foundation, Yonsei University, Seoul (KR)

(72) Inventors: Hyungjun Kim, Seoul (KR); Youngjun Kim, Seoul (KR); Jeong-Gyu Song, Seoul (KR); Jusang Park, Seoul (KR)

(73) Assignee: INDUSTRY-ACADEMIC COOPERATION FOUNDATION, YONSEI UNIVERSITY, Seoul (KR)

( * ) Notice: Subject to any disclaimer, the term of this patent is extended or adjusted under 35 U.S.C. 154(b) by 0 days.

(21) Appl. No.: 14/932,668

(22) Filed: Nov. 4, 2015

(65) Prior Publication Data

US 2016/0122868 A1 May 5, 2016

(30) Foreign Application Priority Data

Nov. 4, 2014 (KR) ........................ 10-2014-0152288

(51) Int. Cl.
*C23C 16/30* (2006.01)
*C01G 39/06* (2006.01)
(Continued)

(52) U.S. Cl.
CPC ............ *C23C 16/305* (2013.01); *C01G 39/06* (2013.01); *C23C 16/45527* (2013.01); *C23C 16/52* (2013.01); *H01L 21/0262* (2013.01); *H01L 21/02422* (2013.01); *H01L 21/02568* (2013.01); *C01P 2002/82* (2013.01); *C01P 2002/85* (2013.01); *C01P 2004/04* (2013.01)

(58) Field of Classification Search
None
See application file for complete search history.

(56) References Cited

U.S. PATENT DOCUMENTS

2003/0213987 A1* 11/2003 Basceri ............... H01L 21/3141
257/296
2005/0121697 A1* 6/2005 Ishida ................ G11C 13/0009
257/200

(Continued)

FOREIGN PATENT DOCUMENTS

KR 10-2012-0137296 12/2012

OTHER PUBLICATIONS

Yu Scientific Reports 3 Article No. 1866 May 21, 2013.*

(Continued)

*Primary Examiner* — Joseph Miller, Jr.
(74) *Attorney, Agent, or Firm* — Procopio, Cory, Hargreaves & Savitch LLP

(57) ABSTRACT

Disclosed is a method for synthesizing a transition metal chalcogenide, in which a transition metal chalcogenide is synthesized on a substrate by atomic layer deposition to sequentially supply a precursor of the transition metal chalcogenide and a reactant so as to have a predetermined synthesis thickness, the transition metal chalcogenide is synthesized at a process temperature of 450° C. or higher and 1000° C. or lower, and the transition metal chalcogenide is synthesized at a process temperature corresponding to the predetermined synthesis thickness.

11 Claims, 8 Drawing Sheets

(51) Int. Cl.
*C23C 16/52* (2006.01)
*H01L 21/02* (2006.01)
*C23C 16/455* (2006.01)

(56) References Cited

U.S. PATENT DOCUMENTS

| | | | | |
|---|---|---|---|---|
| 2007/0234949 | A1* | 10/2007 | Ahn | C23C 16/407 117/88 |
| 2008/0119098 | A1* | 5/2008 | Palley | C23C 16/305 442/64 |
| 2014/0245946 | A1* | 9/2014 | Kong | C30B 25/186 117/95 |
| 2014/0251204 | A1* | 9/2014 | Najmaei | C30B 25/04 117/95 |
| 2016/0233322 | A1* | 8/2016 | Yeh | H01L 29/66969 |

OTHER PUBLICATIONS

Kim, H., Synthesis of large area MoS2 using ALD, 2013, Autumn Conference of the Materials Research Society of Korea and the 25th New Material Symposium, 75 pgs (previously submitted on IDS filed Nov. 4, 2015).

Lee, J., Synthesis and Characterization of MoS2 by Gas Phase Chemical Vapor Deposition, 2013, 82 pgs.

Scharf, T.W., et al., Atomic Layer Deposition of Tungsten Disulphide Solid Lubricant Nanocomposite Coatings on Rolling Element Bearings, Tribology Transactions, 2009, 52(3), pp. 284-292, 10 pgs.

Tan, L.K., et al., Atomic Layer Deposition of MoS2 Film, Nanoscale, 2014, 6, pp. 10584-10588, 5 pgs.

Kim, H., Synthesis and Applicantions of 2D Transition Metal Disulfide (TMDSs) Nanosheet, Apr. 1, 2014, Center for Nanomaterials Characterization (CNC), 70 pgs.

Kim, H., Synthesis and Applications of 2D Transition Metal Disulfides (TMDSs) Nanosheet, Materials Science and Engineering, Apr. 4, 2014, 70 pgs.

Park, J., Synthesis and Applications of 2D Transition Metal Disulfides (TMDSs) Nanosheet, ALD2014, Jun. 17, 2014, 62 pgs.

Kim, H., Synthesis of 2D Transition Metal Disulfides (TMDSs) Nanosheet Using Atomic Layer Deposition, the 2nd International Conference on ALD Applications & 3rd China ALD Conference, Oct. 17, 2014, 56 pgs.

Kim, H., Presentation, Materials Research Society of Korea Conference, Nov. 7, 2013, 75 pgs.

* cited by examiner

METHOD FOR SYNTHESIS OF TRANSITION METAL CHALCOGENIDE

CROSS-REFERENCE TO RELATED APPLICATIONS

A claim for priority under 35 U.S.C. §119 is made to Korean Patent Application No. 10-2014-0152288 filed Nov. 4, 2014, in the Korean Intellectual Property Office, the entire contents of which are hereby incorporated by reference.

STATEMENT REGARDING PRIOR DISCLOSURES BY THE INVENTORS

The inventors of the present application authored and disclosed the subject matter of the present application on Nov. 7, 2013 (Presentation), Apr. 1, 2014 (Presentation), Apr. 4, 2014 (Presentation), Jun. 17, 2014, and Oct. 17, 2014. These prior disclosures have been submitted in an Information Disclosure Statement in the present application as "KIM, H., Presentation, Materials Research Society of Korea Conference, Nov. 7, 2013," "KIM, H., Synthesis and Applications of 2D Transition Metal Disulfide (TMDSs) Nanosheet, Apr. 1, 2014, Center for Nanomaterials Characterization (CNC)," "KIM, H., Synthesis and Applications of 2D Transition Metal Disulfides (TMDSs) Nanosheet, Materials Science and Engineering, Apr. 4, 2014," "ARK, J., Synthesis and Applications of 2D Transition Metal Disulfides (TMDSs) Nanosheet, ALD2014, Jun. 17, 2014," and "KIM, H., Synthesis of 2D Transition Metal Disulfides (TMDSs) Nanosheet Using Atomic Layer Deposition, The 2nd International Conference on ALD Applications & 3rd China ALD Conference, Oct. 17, 2014,"

BACKGROUND

Embodiments of the inventive concepts described herein relate to a method for synthesizing a transition metal chalcogenide, and more particularly, relate to a method for synthesizing a two dimensional transition metal dichalcogenide using atomic layer deposition.

Transition metal chalcogenides are a material which has a high electrical mobility of about 200 cm$^2$/Vs and a significantly excellent on-off ratio of $10^8$. In addition, transition metal chalcogenides exhibit flexibility so as to have an advantage of being suitably used as a channel layer for realizing a flexible thin film transistor and a flexible display, and the like. However, it is difficult to synthesize transition metal chalcogenides in a precisely controlled thickness. In addition, there is a limit to synthesize transition metal chalcogenides on a large-area substrate while maintaining a uniform thickness.

SUMMARY

Embodiments of the inventive concepts provide a method for synthesizing a transition metal chalcogenide on a substrate in a uniform thickness and a large area.

Embodiments of the inventive concepts provide a method for synthesizing a transition metal chalcogenide which can control the synthesis thickness (number of layers) of the transition metal chalcogenide depending on the process temperature.

The embodiments of the inventive concepts are not limited to the above-mentioned embodiments. Other embodiments which are not mentioned will be clearly understood to those skilled in the art from the following description.

One aspect of embodiments of the inventive concepts is directed to provide a method for synthesizing a transition metal chalcogenide including supplying a precursor of the transition metal chalcogenide and a reactant on a substrate by atomic layer deposition to synthesize the transition metal chalcogenide having a predetermined synthesis thickness on the substrate, in which the transition metal chalcogenide is synthesized at a process temperature of 450° C. or higher and 1000° C. or lower and the transition metal chalcogenide is synthesized at a process temperature corresponding to the predetermined synthesis thickness.

The substrate may include an amorphous substrate.

The substrate may include a $SiO_2$ substrate or a $Si_3N_4$ substrate.

The precursor may include one or more kinds of transition metals selected from the group consisting of Ti, Hf, Zr, V, Nb, Ta, Mo, W, Tc, Re, Co, Rh, Ir, Ni, Pd, Pt, Zn, and Sn.

The precursor may include at least one selected from $TiCl_4$, $TiF_4$, $TiI_4$, $HfCl_4$, $HfCp_2Me_2$, $HfI_4$, $Hf(CpMe)_2(OMe)Me$, $ZrCl_4$, $ZrI_4$, $VCl_3$, $VoCl_3$, $NbCl_5$, $TaCl_5$, $TaF_5$, $TaI_5$, $MoCl_5$, $Mo(CO)_6$, $WCl_6$, $WCl_4$, $WF_6$, $WOCl_4$, $TcCl_4$, $ReCl_4$, $ReCl_5$, $ReCl_6$, $CoCl_2$, $CoCp(CO)_2$, $CoI_2$, $Co(acac)_2$, $CoCp_2$, $RhCl_5$, $IrCl_3$, $NiCl_2$, $Ni(acac)_2$, $NiCp_2$, $PdCl_2$, $Pd(thd)_2$, $PtCl_2$, $ZnCl_2$, $ZnMe_2$, $ZnEt_2$, $ZnI_2$, $SnCl_2$, $SnCl_4$, and $SnI_4$.

The reactant may include one or more kinds of chalcogens selected from the group consisting of S, Se, and Te.

The reactant may include at least one selected from a sulfur powder, $H_2S$, diethyl sulfide, dimethyl disulfide, ethyl methyl sulfide, $(Et_3Si)_2S$, a selenium powder, $H_2Se$, diethyl selenide, dimethyl diselenide, ethyl methyl selenide, $(Et_3Si)_2Se$, telenium powder, $H_2Te$, dimethyl telluride, diethyl telluride, ethyl methyl telluride, and $(Et_3Si)_2Te$.

In the method for synthesizing a transition metal chalcogenide, the transition metal chalcogenide may be synthesized at an internal pressure of a reaction chamber for conducting atomic layer deposition in a range of from $10^{-2}$ to 10 torr.

The transition metal chalcogenide may include molybdenum sulfide ($MoS_2$).

In the method for synthesizing a transition metal chalcogenide, a tri-layer transition metal chalcogenide may be synthesized at a process temperature of 450° C. or higher and lower than 600° C.

In the method for synthesizing a transition metal chalcogenide, a bi-layer transition metal chalcogenide may be synthesized at a process temperature of 600° C. or higher and lower than 800° C.

In the method for synthesizing a transition metal chalcogenide, a mono-layer transition metal chalcogenide may be synthesized at a process temperature of 800° C. or higher and lower than 1000° C.

In the method for synthesizing a transition metal chalcogenide, the transition metal chalcogenide may be synthesized by repeating an atomic layer deposition cycle including providing the precursor into the reaction chamber having the substrate disposed therein; providing a purging gas into the reaction chamber; providing the reactant into the reaction chamber; and providing a purging gas into the reaction chamber.

In the method for synthesizing a transition metal chalcogenide, a thickness of the transition metal chalcogenide synthesized on the substrate may increase during a nucleation delay corresponding to the process temperature and the thickness of the transition metal chalcogenide synthesized on the substrate may be maintained after the nucleation delay.

In the method for synthesizing a transition metal chalcogenide, the transition metal chalcogenide may be synthesized by repeating atomic layer deposition cycle by equal to or more than the minimum number of atomic layer deposition cycles corresponding to the nucleation delay.

The minimum number of atomic layer deposition cycles may increase as the process temperature increases.

In the method for synthesizing a transition metal chalcogenide, the transition metal chalcogenide may be synthesized by setting a precursor exposing time to from 3 to 5 seconds.

Another aspect of embodiments of the inventive concepts is directed to provide a method for synthesizing molybdenum sulfide including synthesizing $MoS_2$ in a predetermined synthesis thickness by repeating a atomic layer deposition cycle including providing $MoCl_5$ on an amorphous substrate disposed in a reaction chamber for atomic layer deposition; providing a purging gas into the reaction chamber; providing $H_2S$ into the reaction chamber; and providing a purging gas into the reaction chamber, in which $MoS_2$ is synthesized at a process temperature of 450° C. or higher and 1000° C. or lower and $MoS_2$ is synthesized at a process temperature corresponding to the predetermined synthesis thickness.

In the method for synthesizing molybdenum sulfide, a number of layers of $MoS_2$ synthesized on the substrate may be changed depending on the process temperature.

In the method for synthesizing molybdenum sulfide, a thickness of the $MoS_2$ synthesized on the substrate may increase while repeating the atomic layer deposition cycle by a minimum number of atomic layer deposition cycles corresponding to the process temperature, and the thickness of $MoS_2$ synthesized on the substrate may be maintained without increasing although the atomic layer deposition cycle is further repeated after repeating the atomic layer deposition cycle by the minimum number of atomic layer deposition cycles.

According to embodiments of the inventive concepts, a transition metal chalcogenide can be synthesized in a uniform thickness and a large area.

In addition, according to embodiments of the inventive concepts, the synthesis thickness (number of layers) of the transition metal chalcogenide can be freely controlled depending on the process temperature.

Effects of the invention concepts are not limited to the above-mentioned effects. Effects which are not mentioned will be clearly understood to those skilled in the art from the description and the accompanying drawings.

DETAILED DESCRIPTION

Figure 1:
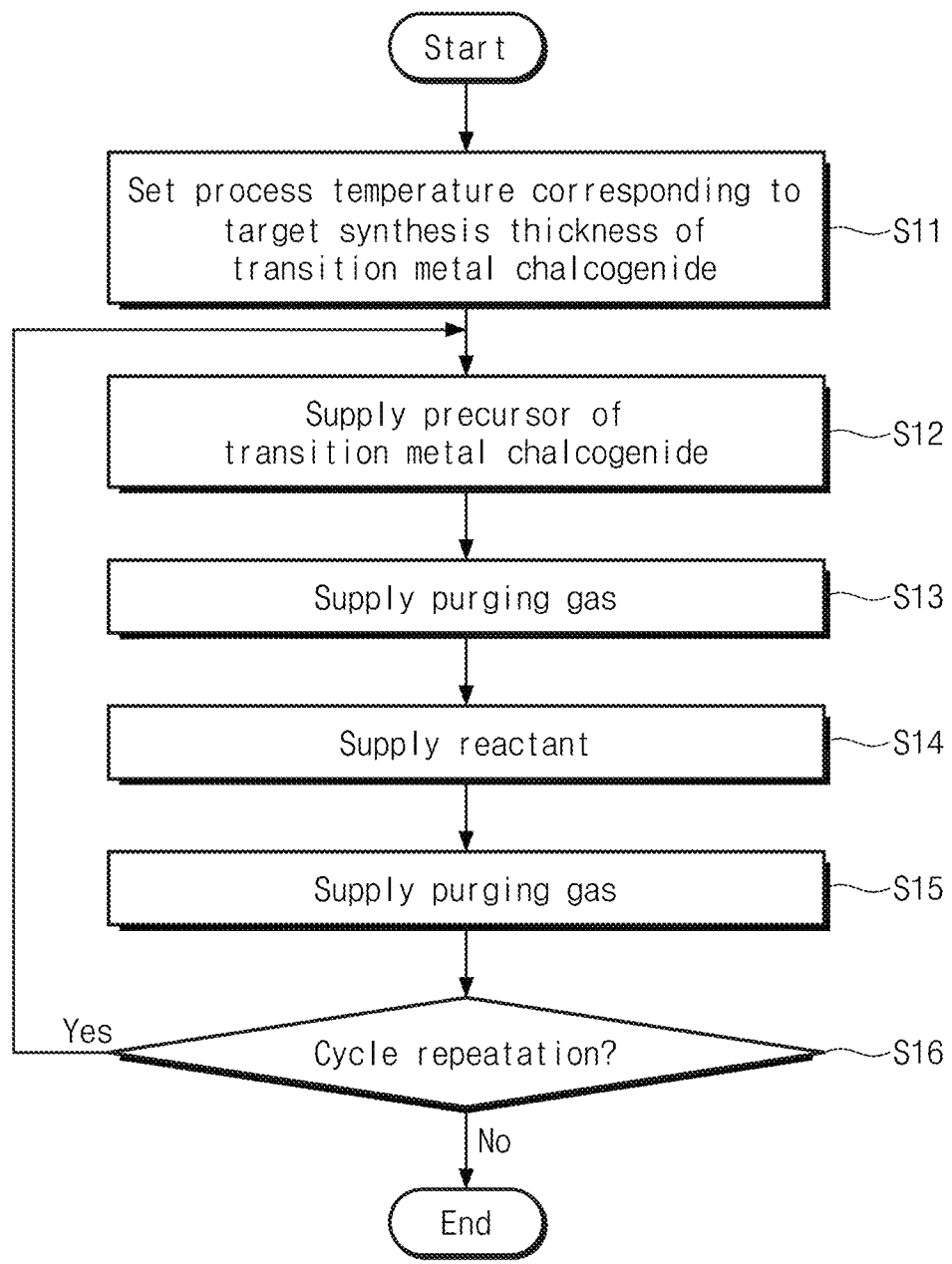
FIG. 1 is a flow diagram of a method for synthesizing a two dimensional transition metal chalcogenide according to an embodiment of the inventive concepts.

Various advantages and features of the inventive concepts and methods accomplishing thereof will become apparent from the following description of embodiments with reference to the accompanying drawings. However, the inventive concept is not limited to exemplary embodiment disclosed herein but will be defined only by the scope of the appended claims. Even though it is not defined, all terms used herein (including technical or scientific terms) have the same meanings as those generally accepted by common techniques in the relevant art to which the inventive concept belongs. General description of the known configurations may be omitted so as not to obscure the spirit of the inventive concepts. The same reference numerals are used for the same elements or corresponding elements in the drawings of the inventive concepts.

The terms used in this application are only used for the purpose of describing particular embodiments, but are not intended to limit the inventive concepts. The singular forms include the plural forms unless otherwise they clearly have a different meaning. In this application, the terms "to comprise", "to have", or "to be equipped with" are intended to designate the presence of the features, numbers, steps, operations, elements, parts, or combinations thereof described in the specification, and it should be understood that the presence or addition of one or more other features, numbers, steps, operations, elements, parts, or combinations thereof are not precluded. The meaning to be formed "on" herein includes that any element is formed on the other element via another element in between them as well as that any element is formed directly on the other element.

The method for synthesizing a transition metal chalcogenide according to embodiments of the inventive concepts synthesizes a transition metal chalcogenide on a substrate by atomic layer deposition to sequentially supply a precursor of the transition metal chalcogenide and a reactant so as to have a predetermined synthesis thickness, and in which the transition metal chalcogenide is synthesized at a process temperature of 450° C. or higher and 1000° C. or lower and the transition metal chalcogenide is synthesized at a process temperature corresponding to the target synthesis thickness. According to embodiments of the inventive concepts, a transition metal chalcogenide can be synthesized in a uniform thickness and a large area, and the synthesis thickness (number of layers) of the transition metal chalcogenide can be freely controlled depending on the process temperature as the transition metal chalcogenide is synthesized by setting the process temperature according to the target synthesis thickness of the transition metal chalcogenide.

In the method for synthesizing a transition metal chalcogenide according to embodiments of the inventive concepts, a transition metal chalcogenide (for example, $MoS_2$ and $WS_2$) may be synthesized on a substrate by repeating an atomic layer deposition cycle including (a) a step of providing a precursor of the transition metal chalcogenide on the substrate; (b) a step of providing a purging gas into the reaction chamber; (c) a step of providing a reactant thereto; and (d) a step of providing a purging gas thereto. At this time, the transition metal chalcogenide may be synthesized at a process temperature of 450° C. or higher and 1000° C. or lower in the steps (a) to (d), and the transition metal chalcogenide may be synthesized by differently setting the process temperature of the steps (a) to (d) according to the target synthesis thickness of the transition metal chalcogenide.

FIG. 1 is a flow diagram of a method for synthesizing a two dimensional transition metal chalcogenide according to an embodiment of the inventive concepts. In the method for synthesizing a transition metal chalcogenide according to an embodiment of the inventive concepts, a two dimensional transition metal chalcogenide is synthesized on a substrate by atomic layer deposition. The transition metal chalcogenide may be formed by a combination of a transition metal (Ti, Hf, Zr, V, Nb, Ta, Mo, W, Tc, Re, Co, Rh, Ir, Ni, Pd, Pt, Zn, or Sn) and a calcogen (S, Se, or Te) such as molybdenum sulfide ($MoS_2$).

Referring to FIG. 1, the process temperature corresponding to the target synthesis thickness of the transition metal chalcogenide is set when the substrate is disposed in the reaction chamber for atomic layer deposition (S11). As the substrate, an amorphous substrate such as a silicon oxide ($SiO_2$) substrate or a silicon nitride ($Si_3N_4$) substrate may be used. The result of the experiment to synthesize a transition metal chalcogenide on an amorphous substrate demonstrates a phenomenon that the atomic layer deposition is conducted by a behavior different from that which has been known.

The number of layers of the transition metal chalcogenide synthesized on the substrate is changed depending on the process temperature, and the thickness of the transition metal chalcogenide does not increase any more but is constantly maintained after the atomic layer deposition cycle is repeated by a certain number. For example, a tri-layer transition metal chalcogenide can be synthesized at a process temperature of 450° C. or higher and lower than 600° C., a bi-layer transition metal chalcogenide can be synthesized at a process temperature of 600° C. or higher and lower than 800° C., and a mono-layer transition metal chalcogenide can be synthesized at a process temperature of 800° C. or higher and lower than 1000° C.

Hence, it is desired to set the process temperature to 450° C. or higher and lower than 600° C. in order to synthesize a tri-layer transition metal chalcogenide (about 2 nm thick), it is desired to set the process temperature to 600° C. or higher and lower than 800° C. in order to synthesize a bi-layer transition metal chalcogenide (about 1.4 nm thick), and it is desired to set the process temperature to 800° C. or higher and lower than 1000° C. in order to synthesize a mono-layer transition metal chalcogenide (about 0.8 nm thick).

The process temperature may be controlled, for example, in a range of 450° C. or higher and lower than 1000° C. by controlling the temperature of the substrate. The experimental result demonstrates that the specific phenomenon of the inventive concepts which occurs at a process temperature of 450° C. or higher and lower than 1000° C. does not occur any more when the process temperature is lower than 450° C. In other words, the result of the experiment conducted at a process temperature of 400° C. demonstrates that a phenomenon that the thickness of the transition metal chalcogenide does not increase any more but is constantly maintained after the atomic layer deposition cycle is repeated by a certain number does not occur and the phenomenon that the number of layers of the transition metal chalcogenide synthesized on the substrate is more at a relatively lower process temperature does not occur.

The transition metal chalcogenide is synthesized in a mono-layer even if the process temperature is set to 900° C. and it is difficult to expect an effect to decrease the number of layers of the transition metal chalcogenide even if the experiment is conducted at a process temperature exceeding 1000° C., and thus it is preferable to synthesize the transition metal chalcogenide by setting the process temperature to 1000° C. or lower in order to minimize the process cost.

After the process temperature is set in step S11, a precursor of the transition metal chalcogenide is supplied to the substrate disposed in the reaction chamber for atomic layer deposition in step S12. The precursor may include a transition metal constituting the transition metal chalcogenide. The precursor may include, for example, one or more kinds of transition metals selected from the group consisting of Ti, Hf, Zr, V, Nb, Ta, Mo, W, Tc, Re, Co, Rh, Ir, Ni, Pd, Pt, Zn, and Sn.

The precursor may include, for example, at least one of $TiCl_4$, $TiF_4$, $TiI_4$, $HfCl_4$, $HfCp_2Me_2$, $HfI_4$, $Hf(CpMe)_2(OMe)Me$, $ZrCl_4$, $ZrI_4$, $VCl_3$, $VoCl_3$, $NbCl_5$, $TaCl_5$, $TaF_5$, $TaI_5$, $MoCl_5$, $Mo(CO)_6$, $WCl_6$, $WCl_4$, $WF_6$, $WOCl_4$, $TcCl_4$, $ReCl_4$, $ReCl_5$, $ReCl_6$, $CoCl_2$, $CoCp(CO)_2$, $CoI_2$, $Co(acac)_2$, $CoCp_2$, $RhCl_5$, $IrCl_3$, $NiCl_2$, $Ni(acac)_2$, $NiCp_2$, $PdCl_2$, $Pd(thd)_2$, $PtCl_2$, $ZnCl_2$, $ZnMe_2$, $ZnEt_2$, $ZnI_2$, $SnCl_2$, $SnCl_4$, or $SnI_4$.

The temperature of the precursor is preferably from 70 to 100° C. The precursor may not be properly deposited on the substrate since the vaporization amount of the precursor is too small when the temperature of the precursor is less than 70° C., and the transition metal chalcogenide may not be synthesized on the substrate in a two dimensional plane structure when the temperature of the precursor is higher than 100° C. Here, the temperature of the precursor is the temperature based on the internal heating temperature of the storage container which stores the precursor before be provided into the reaction chamber.

The precursor exposing time is preferably from 3 to 5 seconds. The transition metal chalcogenide may not be stably formed in a bi-layer at a process temperature of from 600 to 700° C. or the transition metal chalcogenide may not be synthesized in a two dimensional plane structure when the precursor exposing time is shorter than 3 seconds. The productivity may decrease since the process speed is lowered when the precursor exposing time is longer than 5 seconds.

After the precursor is supplied into the reaction chamber in step S12, a purging gas is supplied into the reaction chamber in order to remove the remaining unreacted precursor material (S13). The purging gas may include, for example, an inert gas such as an argon (Ar) gas or a nitrogen (N) gas. After the purging gas is supplied into the reaction chamber in step S13, a reactant is supplied into the reaction chamber in step S14. The reactant may include a chalcogen. The chalcogen may include at least one of S, Se, and Te.

The reactant may include, for example, at least one of a sulfur powder, $H_2S$, diethyl sulfide, dimethyl disulfide, ethyl methyl sulfide, $(Et_3Si)_2S$, a selenium powder, $H_2Se$, diethyl selenide, dimethyl diselenide, ethyl methyl selenide, $(Et_3Si)_2Se$, telenium powder, $H_2Te$, dimethyl telluride, diethyl telluride, ethyl methyl telluride, or $(Et_3Si)_2Te$.

For example, when $MoCl_5$ is used as the precursor and $H_2S$ is used as the reactant, a layer of $MoS_2$ molecule is formed on the substrate by the exchange (substitution) reaction between chlorine constituting $MoCl_5$ adsorbed on a substrate and sulfur constituting $H_2S$ in step S14. After step S14, a purging gas is subsequently supplied into the reaction chamber in order to remove the remaining unreacted substances (S15). The purging gas may include, for example, an inert gas such as an argon (Ar) gas or a nitrogen (N) gas.

The deposition process of step S12 to step S15 is repeated until the number of cycles that is set according to the target thickness of the transition metal chalcogenide, the synthesis process of the transition metal chalcogenide is terminated when the number of cycles reaches the set number of cycles (S16). The internal pressure of the reaction chamber during the atomic layer deposition process is preferably maintained at $10^{-2}$ to 10 torr. The transition metal chalcogenide may not be synthesized since the precursor is hardly adsorbed to the substrate when the process pressure is lower than $10^{-2}$ torr, and a two dimensional uniform thin film may not be formed at a process pressure of higher than 10 torr.

As described above, the process temperature is maintained at 450° C. or higher and 1000° C. or lower during the process to synthesize a transition metal chalcogenide on a substrate by repeating the atomic layer deposition cycle to sequentially supply a precursor of the transition metal chalcogenide and a reactant so as to have a predetermined synthesis thickness. According to embodiments of the inventive concepts, it is possible to synthesize a transition metal chalcogenide having a two dimensional plane structure in a large area and a uniform number of layers using atomic layer deposition and it is possible to freely change the synthesis thickness (number of layers) of the transition metal chalcogenide through the control of the process temperature.

Typically, it has only been known that the deposition thickness increases in proportion to the number of cycles in atomic layer deposition. However, the present inventors have found out for the first time that a phenomenon that the thickness of a transition metal chalcogenide synthesized on an amorphous substrate is changed depending on the process temperature and a phenomenon that the thickness of the transition metal chalcogenide is not thickened to a certain thickness (number of layers) or more after a certain number of cycles is repeated but it is only dependent on the process temperature through the experiment.

In a case in which a transition metal chalcogenide is deposited on a $SiO_2$ substrate in a particular process temperature range by atomic layer deposition according to an embodiment of the inventive concepts, unlike the formerly known fact, the deposition thickness is limited (saturated) when step S12 to step S15 are repeated by a certain number of cycles and the deposition thickness (synthesis thickness) to be saturated is changed particularly depending on the process temperature. Such a distinctive phenomenon of the inventive concepts does not occur in a process temperature range of 400° C. or lower. Consequently, it is possible to synthesize a transition metal chalcogenide in a large area while controlling the number of layers thereof through a new principle that is different from the existing atomic layer deposition. In the experiment of the inventive concepts, a transition metal chalcogenide having a deposition thickness of three layers, a transition metal chalcogenide having a deposition thickness of two layers, and a transition metal chalcogenide having a deposition thickness of one layer have been deposited at a process temperature of 500° C., 700° C., and 900° C., respectively.

In an embodiment of the inventive concepts, the thickness of a transition metal chalcogenide that is synthesized on a substrate increases during the nucleation delay corresponding to the process temperature but the thickness is maintained without increasing after the nucleation delay. In an embodiment of the inventive concepts, it is possible to synthesize a transition metal chalcogenide for a process time equal to or longer than the nucleation delay.

According to an embodiment of the inventive concepts, it is possible to synthesize a transition metal chalcogenide by repeating the atomic layer deposition cycle by equal to or more than the minimum number of atomic layer deposition cycles corresponding to the nucleation delay. The nucleation delay increases as the process temperature increases, and the minimum number of atomic layer deposition cycles also increases as the process temperature increases in the same manner as the nucleation delay.

For example, the minimum number of atomic layer deposition cycles may be about 70 times or more and less than 90 times when the process temperature is set to 450° C. or higher and lower than 600° C., the minimum number of atomic layer deposition cycles may be about 90 times or more and less than 120 times when the process temperature is set to 600° C. or higher and lower than 700° C., and the minimum number of atomic layer deposition cycles may be about 120 times or more and less than 140 times when the process temperature is set to 700° C. or higher and 1000° C. or lower.

Hereinafter, the method for synthesizing a transition metal chalcogenide according to embodiments of the inventive concepts will be more specifically described with reference to the experimental results. In the experiment, a tube-shaped atomic layer deposition vacuum apparatus was used, a silicon oxide ($SiO_2$) substrate was used as the substrate, molybdenum chloride ($MoCl_5$) was used as the precursor, and a hydrogen sulfide $H_2S$ gas was used as the reactant. Argon (Ar) was used as the purging gas, the atomic layer deposition process was conducted under a condition of maintaining the degree of vacuum in a range of from $10^{-2}$ to 10 torr.

The synthesis of a transition metal chalcogenide was conducted in a process temperature range of from 500 to 900° C. The $SiO_2$ substrate exhibits amorphous properties, and thus it exhibits properties different from a crystalline $Al_2O_3$ (sapphire) substrate and requires process conditions different from those for the crystalline $Al_2O_3$ (sapphire) substrate. At a process temperature of 400° C., a transition metal chalcogenide having a two dimensional plane structure was not synthesized, the process temperature dependent phenomenon of the number of layers did not occur any more, and the phenomenon that the deposition thickness was saturated after repeating a certain number of cycles did not occur as well.

It was able to confirm that a transition metal chalcogenide was synthesized in a two dimensional film form in accordance with embodiments of the inventive concepts through the image taken using an optical microscope. The analysis using Raman spectroscopy and an atomic force microscope (AFM) was carried out in order to determine the number of layers of the transition metal chalcogenide thus synthesized.

Figure 2:
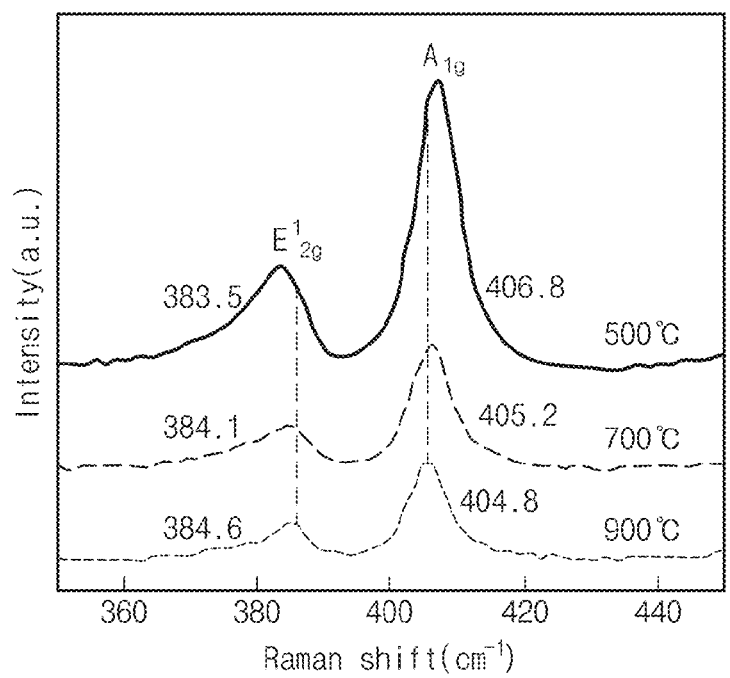
FIG. 2 is a graph illustrating the distribution of Raman shift of a transition metal chalcogenide synthesized in accordance with an embodiment of the inventive concepts.

FIG. 2 is a graph illustrating the distribution of Raman shift of the transition metal chalcogenide synthesized in accordance with an embodiment of the inventive concepts. FIG. 2 illustrates the distribution of Raman shift of the transition metal chalcogenide synthesized by repeating the atomic layer deposition cycle 120 times. Referring to FIG. 2, the thickness of the transition metal chalcogenide can be determined from the difference value $(A_{1g}-E^1_{2g})$ $(cm^{-1})$ between the Raman shift value of the left peak $(E^1_{2g})$ and the Raman shift value of the right peak $(A_{1g})$ of the two peaks appearing in the distribution of Raman shift, and it indicates that the synthesis thickness of the transition metal chalcogenide is greater as the difference value is greater.

Figure 3:
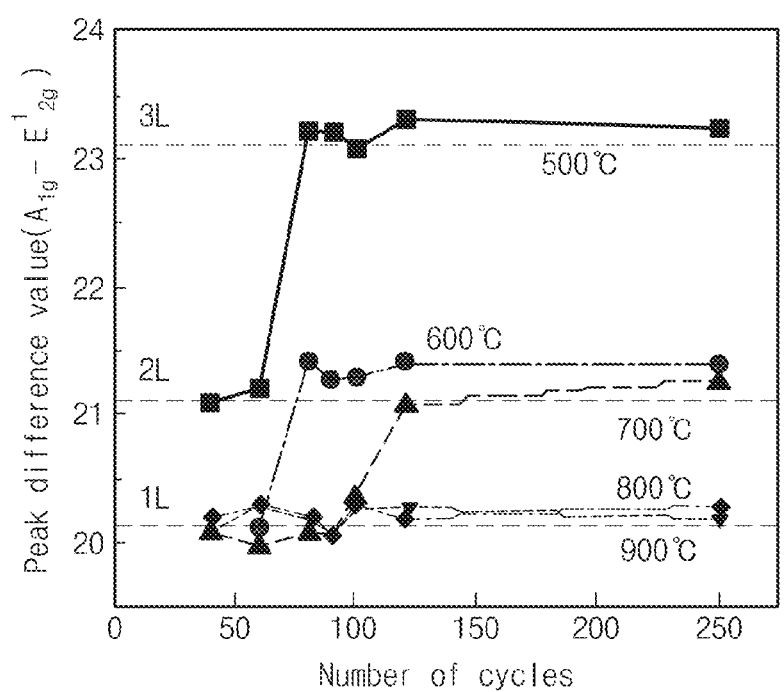
FIG. 3 is a graph illustrating the peak difference values calculated from the distribution of Raman shift illustrated in FIG. 2 measured by changing the number of atomic layer deposition cycles.

FIG. 3 is a graph illustrating the peak difference values calculated from the distribution of Raman shift illustrated in FIG. 2 measured by changing the number of atomic layer deposition cycles. Referring to and 3, it indicates that a mono-layer transition metal chalcogenide is synthesized when the peak difference value is 21 or less, a bi-layer transition metal chalcogenide is synthesized when the peak difference value is more than 21 and less than 23, and a tri-layer transition metal chalcogenide is synthesized when the peak difference value is 23 or more and 24 or less. From the graph of FIG. 3, it can be seen that the synthesis thickness (number of layers) of the transition metal chalcogenide is changed depending on the process temperature.

The thickness of a transition metal chalcogenide was measured using an atomic force microscope, and the results demonstrated that a transition metal chalcogenide having a thickness of a tri-layer (about 2 nm) was synthesized when the process temperature was set to 500° C., a transition metal chalcogenide having a thickness of a bi-layer (about 1.4 nm) was synthesized when the process temperature was set to 700° C., and, a transition metal chalcogenide having a thickness of a mono-layer (about 0.8 nm) was synthesized when the process temperature was set to 900° C. At this time, the thickness of one layer is about 0.7 nm.

In addition, it can be seen that a mono-layer is synthesized at a process temperature of 800° C. or higher no matter how many the number of atomic layer deposition cycles is increased, a bi-layer is synthesized at a process temperature of from 600 to 800° C. no matter how many the number of atomic layer deposition cycles is increased, and the number of layers is converged to a tri-layer at a process temperature of 600° C. or lower no matter how many the number of atomic layer deposition cycles is increased. From this phenomenon, it can be seen that the thickness of the transition metal chalcogenide under a particular process temperature condition is converged to a certain synthesis thickness that is determined in correspondence to the process temperature. In the case of an experiment in which $WS_2$ was synthesized using $WCl_6$ as the precursor and $H_2S$ as the reactant as well, the phenomenon that the thickness of $WS_2$ was not thickened to a certain thickness or more when the experiment was conducted at a process temperature of 700° C. was observed.

In addition, it can be seen that the nucleation delay is longer as the process temperature is higher from the results of an experiment in which the process temperature was changed from 500° C. to 600 and 700° C. Accordingly, the minimum number of atomic layer deposition cycles was about 65 times when the process temperature was set to 500° C., the minimum number of atomic layer deposition cycles was about 75 times when the process temperature was set to 600° C., and the minimum number of atomic layer deposition cycles was about 120 times when the process temperature was set to 700° C. The thickness hardly changed even though the atomic layer deposition cycle was repeated by equal to or more than the minimum number of atomic layer deposition cycles.

Figure 4:
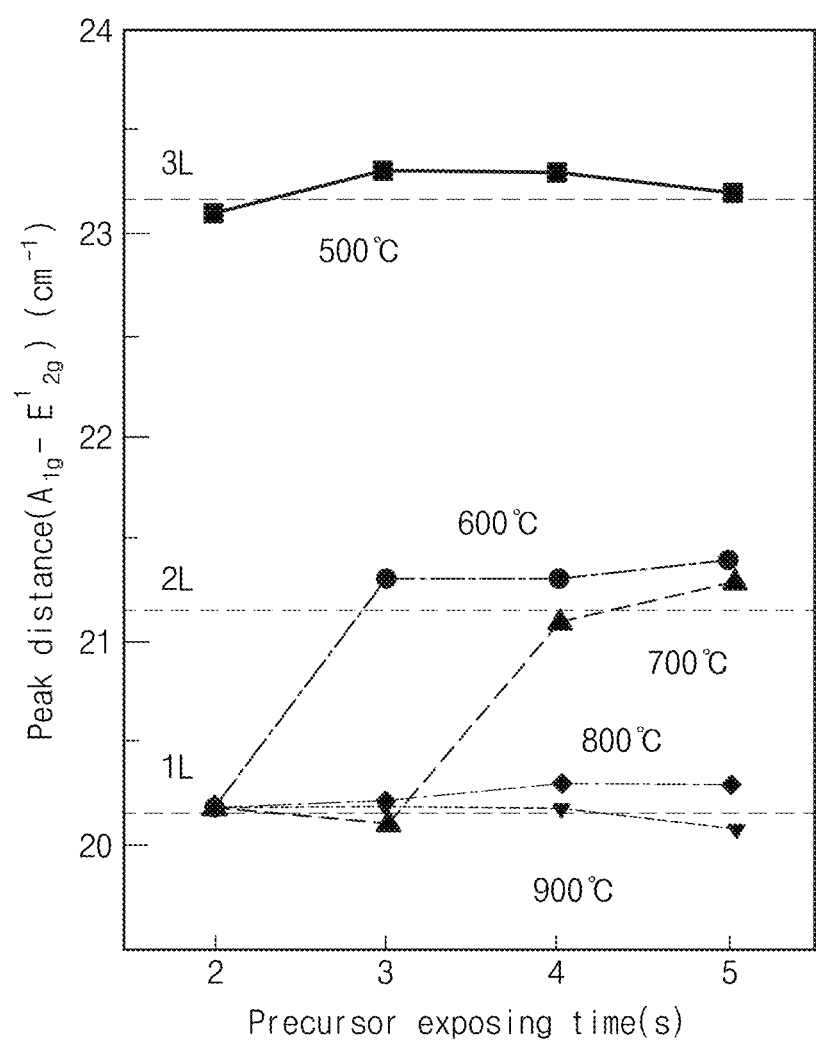
FIG. 4 is a graph illustrating the peak distance values calculated from the distribution of Raman shift illustrated in FIG. 2 measured by changing the precursor exposing time.

FIG. 4 is a graph illustrating the peak distance values calculated from the distribution of Raman shift illustrated in FIG. 2 measured by changing the precursor exposing time. Referring to FIG. 4, the precursor exposing time is preferably from 3 to 5 seconds. The transition metal chalcogenide may not be stably formed in a bi-layer at a process temperature of from 600 to 700° C. or the transition metal chalcogenide may not be synthesized in a two dimensional plane structure when the precursor exposing time is shorter than 3 seconds. The productivity may decrease since the process speed is lowered when the precursor exposing time is longer than 5 seconds.

It is more preferable that the precursor exposing time is 3 seconds when the process temperature is less than 650° C. and the precursor exposing time is 4 seconds when the process temperature is 650° C. or higher. From FIG. 4, it can be seen that the thickness of the transition metal chalcogenide is constant even though the precursor exposing time is longer than 3 seconds when the process temperature is 600° C. and the thickness of the transition metal chalcogenide is constant even though the precursor exposing time is longer than 4 seconds when the process temperature is 700° C. due to the self-limiting reaction (reaction taking place on the substrate surface) on the substrate.

Figure 5:
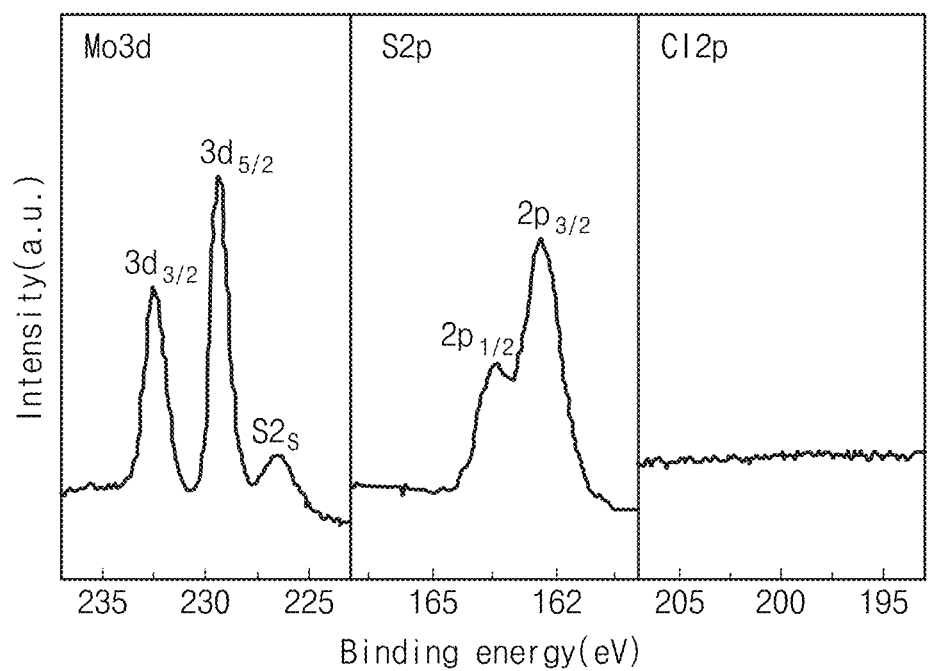
FIG. 5 is a graph illustrating the distribution of binding energy of molybdenum (Mo), sulfur (S), and chlorine (Cl) in a transition metal chalcogenide formed in accordance with an embodiment of the inventive concepts.

FIG. 5 is a graph illustrating the distribution of binding energy of molybdenum (Mo), sulfur (S), and chlorine (Cl) in a transition metal chalcogenide formed in accordance with embodiments of the inventive concepts. The distribution of binding energy was measured by X-ray photoelectron spectroscopy (XPS). In the distribution of binding energy, molybdenum (Mo) has peaks at $3d_{3/2}$ and $3d_{5/2}$ and sulfur (S) has peaks at $2p_{3/2}$ and $2p_{1/2}$. There is no peak for chlorine (Cl) in the distribution of binding energy, and thus it can be seen that Cl is not contained in the transition metal chalcogenide as an impurity.

From this, it can be seen that the transition metal chalcogenide ($MoS_2$) is formed through the substitution between chlorine constituting the precursor that is adsorbed on the substrate and sulfur constituting the reactant. The content ratio of molybdenum to sulfur in molybdenum sulfide was analyzed from the intensity ratio of the binding energy of molybdenum to sulfur, and the content ratio (molar ratio) of Mo to S was 1:1.98 (calculated on the basis of area) to be approximately the same as the theoretical molar ratio (1:2).

Figure 6:
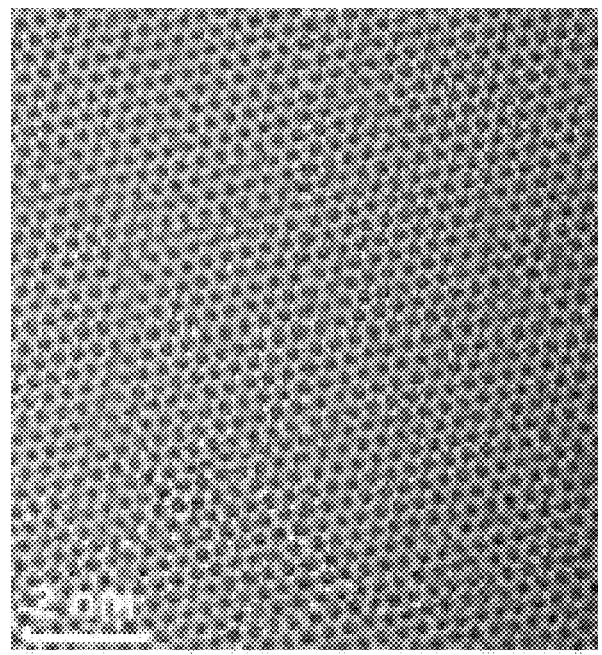
FIGS. 6 to 8 are images of the transition metal chalcogenides synthesized in accordance with embodiments of the inventive concepts taken using a TEM (transmission electron microscope).
Figure 7:
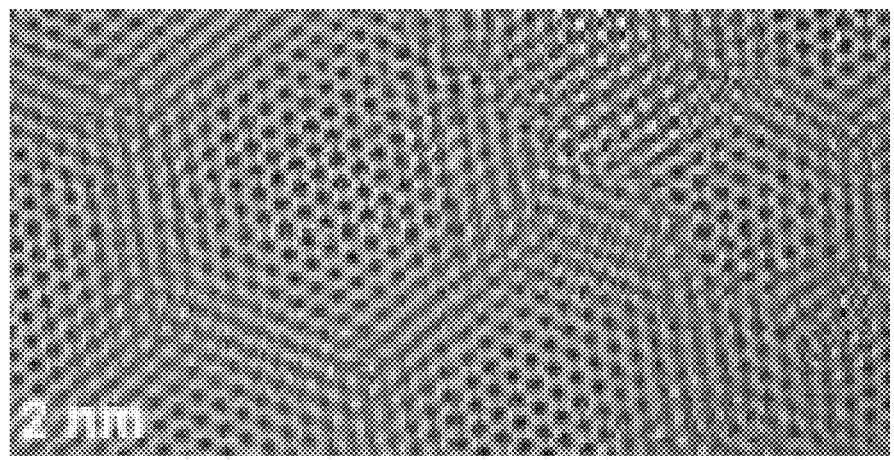
Figure 8:
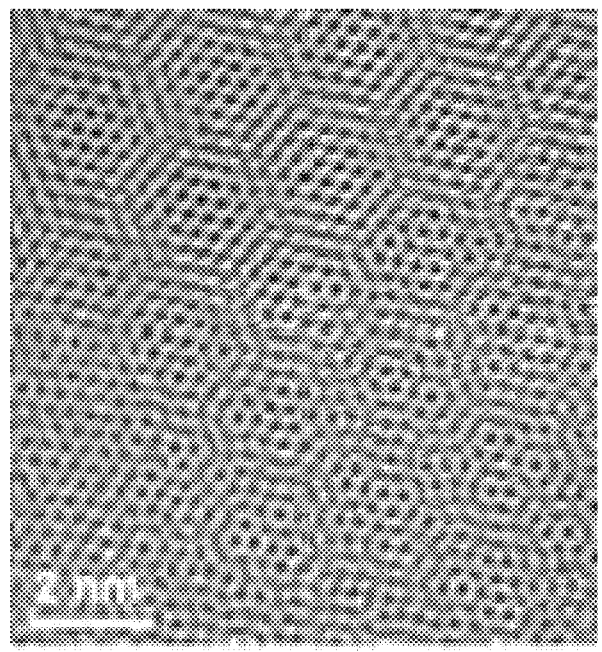

FIGS. 6 to 8 are images of the transition metal chalcogenides synthesized in accordance with embodiments of the inventive concepts taken using a TEM (transmission electron microscope). FIG. 6 is the image of the transition metal chalcogenide synthesized at a process temperature of 900° C., FIG. 7 is the image of the transition metal chalcogenide synthesized at a process temperature of 700° C., and FIG. 8 is the image of the transition metal chalcogenide synthesized at a process temperature of 500° C.

Referring to FIGS. 6 to 8, it can be seen that two dimensional transition metal chalcogenides having a lattice structure with directionality in 100 (lattice constant d=0.27 nm) and 110 (lattice constant d=0.16 nm) are formed and thus the transition metal chalcogenides synthesized in accordance with embodiments of the inventive concepts are arranged in a two dimensional plane form. In FIGS. 6 and 7, a moire pattern is observed, and this indicates that a transition metal chalcogenide having two or more layers has been synthesized.

Figure 9:
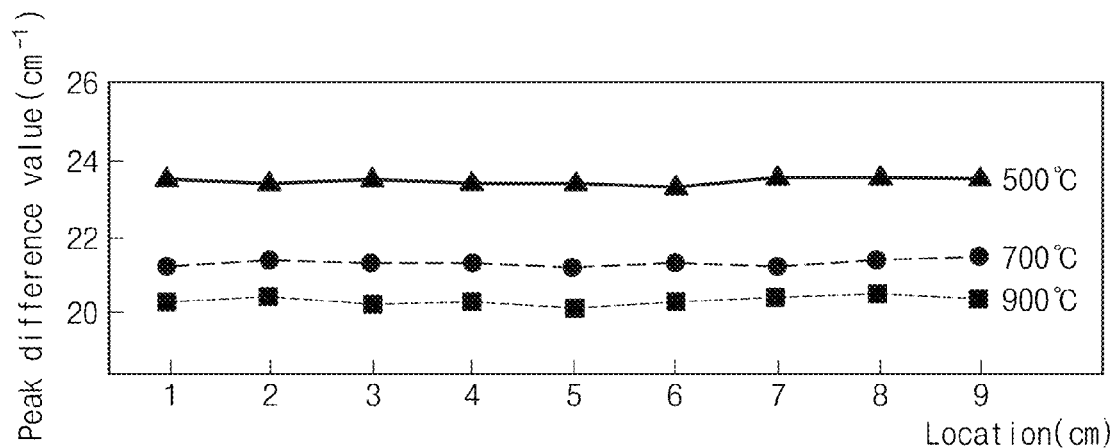
FIG. 9 is a graph illustrating the peak difference values of transition metal chalcogenides synthesized at different process temperatures in accordance with embodiments of the inventive concepts measured at 1 cm intervals.
Figure 10:
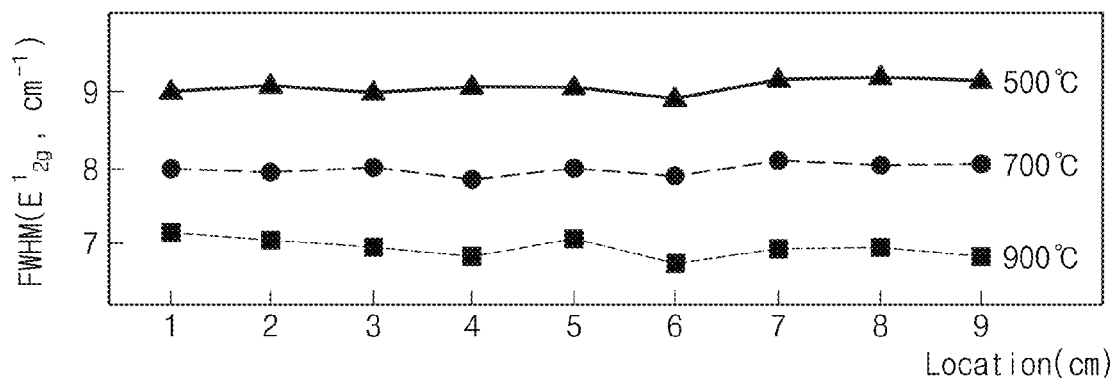
FIG. 10 is a graph illustrating the FWHM (full width at half maximum, $E^1_{2g}$) values of transition metal chalcogenides synthesized at different process temperatures in accordance with embodiments of the inventive concepts measured at 1 cm intervals.
Figure 11:
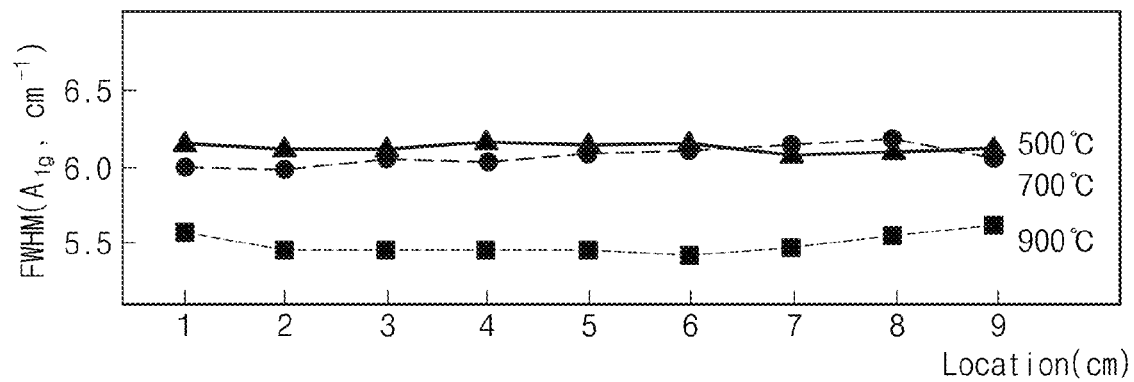
FIG. 11 is a graph illustrating the FWHM (full width at half maximum, $E^1_{2g}$) values of transition metal chalcogenides synthesized at different process temperatures in accordance with embodiments of the inventive concepts measured at cm intervals.

FIG. 9 is a graph illustrating the peak difference values of transition metal chalcogenides synthesized at different process temperatures in accordance with embodiments of the inventive concepts measured at 1 cm intervals, FIG. 10 is a graph illustrating the FWHM (full width at half maximum, $E^1_{2g}$) values of transition metal chalcogenides synthesized at different process temperatures in accordance with embodiments of the inventive concepts measured at 1 cm intervals, and FIG. 11 is a graph illustrating the FWHM (full width at half maximum, $A_{1g}$) values of transition metal chalcogenides synthesized at different process temperatures in accordance with embodiments of the inventive concepts measured at 1 cm intervals. From the results of FIGS. 9 to 11, it has been confirmed that the transition metal chalcogenides have been uniformly deposited over a large area in accordance with embodiments of the inventive concepts. According to embodiments of the inventive concepts, it is possible to synthesize a two dimensional transition metal chalcogenide having a large area of 9 cm$^2$ or more and a uniformly controlled number of layers.

According to embodiments of the inventive concepts, there is an advantage that it is possible to deposit a two dimensional transition metal chalcogenide having a uniform thickness in a large area and to control the thickness (number of layers) of a significantly thin layer depending on the process temperature. A transition metal chalcogenide synthesized by the method for synthesizing a transition metal chalcogenide according to embodiments of the inventive concepts has a high electron mobility and thus can replace the LTPS and IGZO materials that are currently used in a thin film transistor (TFT), and the transition metal chalcogenide exhibits flexibility and thus can be applied to flexible devices such as a flexible thin film transistor and a flexible display and various electronic devices such as an active layer of a semiconductor, a gas sensor, and other catalysts.

While the inventive concepts has been described with reference to exemplary embodiments, it will be apparent to those skilled in the art that various changes and modifications may be made without departing from the spirit and scope of the inventive concepts. The scope of the inventive concepts should be defined by the spirit of the appended claims, and the scope of the inventive concepts is defined not by the detailed description of the inventive concepts but by the appended claims, and inventive concepts equivalent within the scope will be substantially construed as being included in the inventive concepts.

What is claimed is:

1. A method for synthesizing a transition metal chalcogenide, the method comprising:
    supplying a precursor of the transition metal chalcogenide and a reactant on a substrate by atomic layer deposition to synthesize the transition metal chalcogenide on the substrate, wherein
    the precursor includes molybdenum (Mo),
    the reactant includes sulfur (S),
    the transition metal chalcogenide includes molybdenum sulfide (MoS$_2$),
    the transition metal chalcogenide is synthesized at a process temperature of 450° C. or higher and 1000° C. or lower, and
    a thickness of the MoS$_2$ synthesized on the substrate increases while repeating an atomic layer deposition cycle by a minimum number of atomic layer deposition cycles corresponding to the process temperature, and the thickness of MoS$_2$ synthesized on the substrate is maintained without increasing although the atomic layer deposition cycle is further repeated after repeating the atomic layer deposition cycle by the minimum number of atomic layer deposition cycles.

2. The method according to claim 1, wherein the substrate includes an amorphous substrate.

3. The method according to claim 2, wherein the substrate includes a SiO$_2$ substrate or a Si$_3$N$_4$ substrate.

4. The method according to claim 1, wherein the precursor includes MoCl$_5$.

5. The method according to claim 1, wherein the reactant includes H$_2$S.

6. The method according to claim 1, wherein the transition metal chalcogenide is synthesized at an internal pressure of a reaction chamber for conducting atomic layer deposition in a range of from 10$^{-2}$ to 10 torr.

7. The method according to claim 1, wherein a tri-layer transition metal chalcogenide is synthesized at a process temperature of 450° C. or higher and lower than 600° C.

8. The method according to claim 1, wherein a bi-layer transition metal chalcogenide is synthesized at a process temperature of 600° C. or higher and lower than 800° C.

9. The method according to claim 1, wherein a mono-layer transition metal chalcogenide is synthesized at a process temperature of 800° C. or higher and lower than 1000° C.

10. The method according to claim 1, wherein the transition metal chalcogenide is synthesized by setting a precursor exposing time to from 3 to 5 seconds.

11. A method for synthesizing molybdenum sulfide, the method comprising:
    synthesizing MoS$_2$ by repeating a atomic layer deposition cycle including providing MoCl$_5$ on an amorphous substrate disposed in a reaction chamber for atomic layer deposition; providing a purging gas into the reaction chamber; providing H$_2$S into the reaction chamber; and providing a purging gas into the reaction chamber, wherein
    MoS$_2$ is synthesized at a process temperature of 450° C. or higher and 1000° C. or lower, and
    a thickness of the MoS$_2$ synthesized on the substrate increases while repeating an atomic layer deposition cycle by a minimum number of atomic layer deposition cycles corresponding to the process temperature, and the thickness of MoS$_2$ synthesized on the substrate is maintained without increasing although the atomic layer deposition cycle is further repeated after repeating the atomic layer deposition cycle by the minimum number of atomic layer deposition cycles.

* * * * *